(12) United States Patent
Forstner

(10) Patent No.: US 8,977,210 B2
(45) Date of Patent: Mar. 10, 2015

(54) RADIO-FREQUENCY CIRCUIT

(75) Inventor: Johann Peter Forstner, Steinhöring (DE)

(73) Assignee: Infineon Technologies AG, Neubiberg (DE)

( * ) Notice: Subject to any disclaimer, the term of this patent is extended or adjusted under 35 U.S.C. 154(b) by 2504 days.

(21) Appl. No.: 11/680,855

(22) Filed: Mar. 1, 2007

(65) Prior Publication Data

US 2008/0194206 A1 Aug. 14, 2008

(30) Foreign Application Priority Data

Feb. 14, 2007 (DE) .......................... 10 2007 007 356

(51) Int. Cl.
  *H04B 17/00* (2006.01)
  *G01R 23/00* (2006.01)
  *G01R 31/28* (2006.01)
  *G01R 1/067* (2006.01)

(52) U.S. Cl.
  CPC ........ *G01R 31/2822* (2013.01); *G01R 31/2884* (2013.01); *G01R 1/06772* (2013.01)
  USPC ............. 455/67.11; 327/344; 438/11; 438/18

(58) Field of Classification Search
  USPC ..................... 455/67.11; 438/11, 18; 327/344
  See application file for complete search history.

(56) References Cited

U.S. PATENT DOCUMENTS

| | | | |
|---|---|---|---|
| 3,517,306 A | 6/1970 | Anderson et al. | |
| 4,460,877 A | 7/1984 | Sterns | 333/26 |
| 4,943,955 A | 7/1990 | Rabian et al. | |
| 4,982,164 A * | 1/1991 | Schiek et al. | 324/638 |
| 5,444,311 A * | 8/1995 | Imai et al. | 327/565 |
| 6,146,908 A * | 11/2000 | Falque et al. | 438/11 |
| 2002/0063596 A1* | 5/2002 | Brandt | 330/53 |
| 2004/0198284 A1* | 10/2004 | Khorram | 455/226.1 |
| 2005/0052245 A1* | 3/2005 | Rofougaran | 330/301 |
| 2005/0247931 A1* | 11/2005 | Seshan | 257/48 |
| 2007/0120742 A1* | 5/2007 | Soler et al. | 343/700 MS |
| 2007/0146044 A1* | 6/2007 | Igarashi et al. | 327/359 |
| 2007/0236305 A1* | 10/2007 | Kearns et al. | 333/12 |
| 2007/0274242 A1* | 11/2007 | Lamacraft et al. | 370/310 |
| 2007/0279231 A1* | 12/2007 | Cheng et al. | 340/572.7 |
| 2008/0158926 A1* | 7/2008 | Umeda et al. | 363/127 |

FOREIGN PATENT DOCUMENTS

| | | | | |
|---|---|---|---|---|
| DE | 4027686 A1 | 3/1991 | | |
| DE | 103 26 716 A1 | 1/2005 | ............ | H01L 21/822 |

* cited by examiner

*Primary Examiner* — Nay A Maung
*Assistant Examiner* — Erica Fleming-Hall
(74) *Attorney, Agent, or Firm* — Eschweiler & Associates, LLC

(57) ABSTRACT

A radio-frequency circuit has a signal processing unit for processing a symmetrical input signal, two signal inputs for receiving the symmetrical input signal, a connection which is used as a ground point for the symmetrical signal, and a line which connects the signal inputs and has a length which essentially corresponds to an odd-numbered multiple of half the wavelength of the input signal. A method for testing a radio-frequency circuit having a signal processing unit for processing a symmetrical input signal is additionally provided.

21 Claims, 7 Drawing Sheets

RADIO-FREQUENCY CIRCUIT

RELATED APPLICATION

This application claims priority from German Patent Application No. DE 10 2007 007 356.0, which was filed on Feb. 14, 2007, and is incorporated herein by reference in its entirety.

TECHNICAL FIELD

The invention relates to a radio-frequency circuit, which comprises a signal processing unit for processing a symmetrical input signal, and to a method for testing this radio-frequency circuit.

Embodiments of the invention generally relate to radio-frequency circuits and to methods for testing them.

BACKGROUND

Electronic components and chips are tested during production or following production. Automatic test apparatuses (automatic test equipment, ATE) may be used, for example, to subject chips or electronic components to marginal tests, parameter tests or functional tests.

In order to test the function of differential integrated circuits, a symmetrical (differential) test input signal is generally needed to test the error-free function of the circuit. Particularly in the case of circuits for the extra-high frequency range above approximately 20 GHz, the problem arises in this case that it is technically difficult to generate corresponding differential test signals on account of the very short wavelengths in the millimeter range since the requisite phase difference of 180 degrees often cannot be ensured on account of mechanical tolerances and production tolerances. In addition, corresponding devices such as frequency generators with a symmetrical output are very expensive. Therefore, the testing of extra-high frequency circuits with a differential input is problematic, which is additionally due to the lack of availability of corresponding measurement technology such as differential measuring tips for the frequency range above approximately 20 GHz.

On account of the abovementioned difficulties, such extra-high frequency circuits are often tested using alternative methods, for instance by measuring DC and low-frequency properties. Some of these results are additionally correlated with data obtained from monitoring the production process (Process Control Monitoring—PCM). However, the actual function of the components is not measured during such methods or similar methods. Therefore, they generally result in higher rates of undetected errors than tests which relate to the function of the components under relatively practical conditions.

SUMMARY

Against the background of continually increasing quality demands of consumers, cost-effective test methods which enable a high error detection rate by functionally measuring the extra-high frequency properties of components are therefore desirable.

According to an embodiment, a radio-frequency circuit may comprise a signal processing unit for processing a symmetrical input signal, two signal inputs for receiving the symmetrical input signal, a connection which is used as a ground point for the symmetrical signal, and a line which connects the signal inputs and has a length which essentially corresponds to an odd-numbered multiple of half the wavelength of the input signal.

BRIEF DESCRIPTION OF THE DRAWINGS

Embodiments of the invention will be described below with reference to exemplary embodiments which are shown in the appended figures. However, the invention is not restricted to the specifically described exemplary embodiments but rather may be modified and varied in a suitable manner. It is within the scope of the invention to combine individual features and combinations of features of one exemplary embodiment with features and combinations of features of another exemplary embodiment.

DETAILED DESCRIPTION

The invention will be explained below with reference to exemplary embodiments. In order to simplify understanding of the description, identical reference numbers are used below when identical elements which are used together in the figures are involved. Elements in one embodiment may also be used in another embodiment without this being individually mentioned in each case.

A first embodiment provides a radio-frequency circuit. It may comprise a signal processing unit for processing a symmetrical input signal as well as two signal inputs for receiving the symmetrical input signal and a connection which is used as a ground point for the symmetrical signal. A line whose length essentially corresponds to an odd-numbered multiple of half the wavelength of the input signal connects the signal inputs.

Another embodiment provides a standard cell for use in a design system for designing radio-frequency circuits. The standard cell may comprise two signal inputs for receiving a symmetrical input signal, a connection which is used as a ground point for the symmetrical signal as well as a line which connects the signal inputs and has a length which essentially corresponds to an odd-numbered multiple of half the wavelength of the input signal.

Another embodiment provides a design system for designing radio-frequency circuits. The design system may comprise a standard cell database for storing the parameters of standard cells, the parameters of a standard cell being stored in the standard cell database.

Another embodiment provides a method for testing a radio-frequency circuit having a signal processing unit for processing a symmetrical input signal. The method may comprise the steps of: providing a radio-frequency circuit, applying an asymmetrical radio-frequency test signal between one of the signal inputs and the connection which is used as a ground point, and measuring a signal response of the radio-frequency circuit.

Figure 1A:
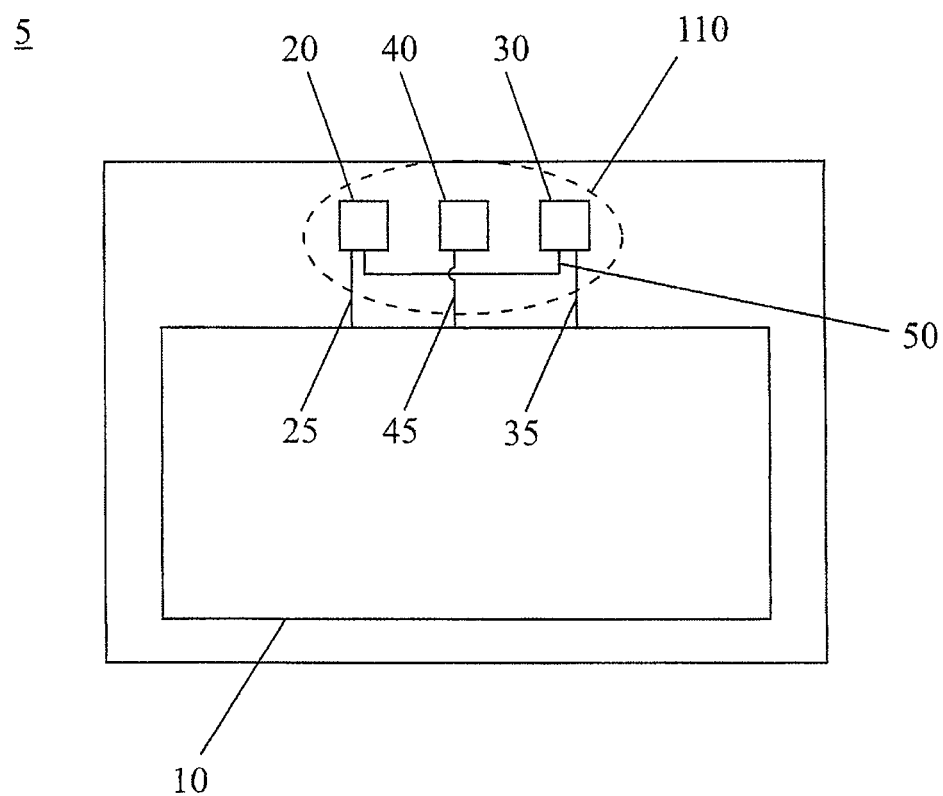
FIGS. 1a-1c respectively show a radio-frequency circuit having a line which connects the signal inputs, in accordance with embodiments described herein.

FIG. 1a diagrammatically shows one embodiment of a radio-frequency circuit 5. The radio-frequency circuit comprises a signal processing unit 10 for processing a symmetrical input signal. Two signal inputs 20, 30 are used to receive the symmetrical input signal. A connection 40 is used as a ground point for a symmetrical input signal. The two signal inputs 20, 30 are connected by means of a line 50 whose length essentially corresponds to an uneven integer (1, 3, 5, 7, etc.) multiple of half the wavelength λ of the input signal (λ/2 phase line). The radio-frequency circuit 5 also comprises one or more outputs (not depicted) for the signal which is processed by the signal processing unit and is referred to as the output signal.

Figure 1B:
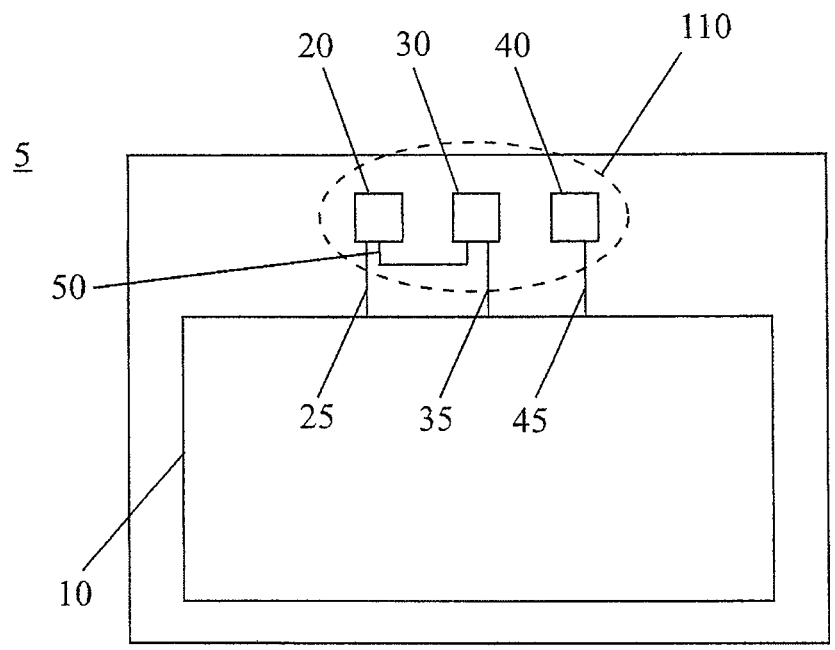
Figure 1C:
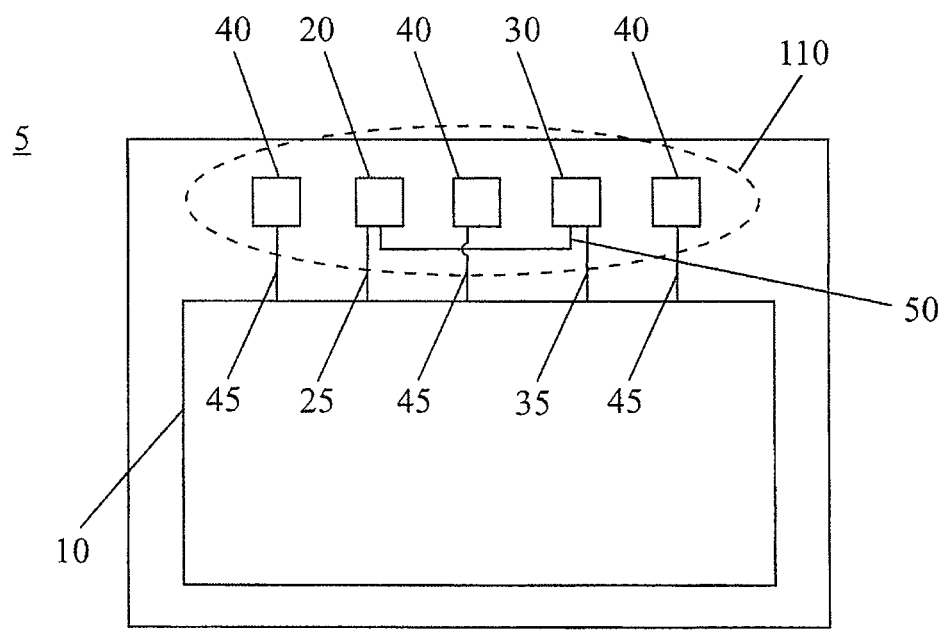

FIGS. 1b and 1c show further embodiments of the radio-frequency circuit 5. In FIG. 1b, the two signal inputs 20, 30 and the ground point 40 are arranged in a row in accordance with a scheme signal input 20—signal input 30—ground point 40. FIG. 1c shows an embodiment in which a plurality of ground points 40 are provided. According to sn embodiment, a wide variety of arrangements of one or more ground points 40 in relation to the signal inputs 20, 30 are possible, designs with different shapes and sizes of the ground points 40 also being possible.

Connecting the two signal inputs 20, 30 to the line 50 gives rise to an effect which makes it possible to use a simplified test method in accordance with an exemplary embodiment. If an asymmetrical extra-high frequency input signal is applied to only one of the two inputs 20, 30 with respect to the ground point, part of this signal is conducted, via the line 50, to the other signal input with a phase shift of 180°. In this case, the impedance of the line is of secondary importance as long as its length ensures the phase offset of 180°. In this manner, a quasi-symmetrical input signal is generated from an asymmetrical input signal. Consequently, the radio-frequency circuit can be tested using a cost-effective test environment, namely an asymmetrical signal generator and conventional measuring tips.

In one exemplary embodiment, the two signal inputs 20, 30 each have a real impedance of 50 ohms, corresponding to a differential impedance of 100 ohms. If an asymmetrical signal is applied to one of the two inputs 20, 30, a real impedance of 25 ohms (single-ended) is present at the feed point, for example a measuring tip. In this case, matching with a return loss of 10 dB can be declared to be good.

If the radio-frequency circuit 5 is operated with a symmetrical/differential input signal during subsequent correct operation, the line 50 does not influence the function of the circuit because the short circuit in the plane of symmetry is transformed into respective idling at the two signal inputs 20, 30 using two respective λ/4 line segments.

The signal inputs 20, 30 comprise the connection pads and the signal lines 25, 35 which connect the connection pads to the signal processing unit 10. The line 50 which connects the signal inputs may be directly connected to the connection pads of the signal inputs 20, 30, as shown in FIG. 1a. However, it is also possible for the line 50 to connect the signal inputs 20, 30 by connecting the line 50 to the signal lines 25 and 35.

FIG. 1a likewise shows a standard cell 110 having the signal inputs 20, 30 for receiving the symmetrical input signal. A connection 40 is used as a ground point for the symmetrical input signal. The two signal inputs 20, 30 are connected by means of a line 50 whose length essentially corresponds to an uneven integer (1, 3, 5, 7, etc.) multiple of half the wavelength λ of the input signal (λ/2 phase line). Design systems having one or more databases containing a multiplicity of standard cells are often used when designing integrated circuits. The corresponding parameters of the standard cells are stored in these standard cell databases and the standard cells may thus be used efficiently for the design process.

Figure 2:
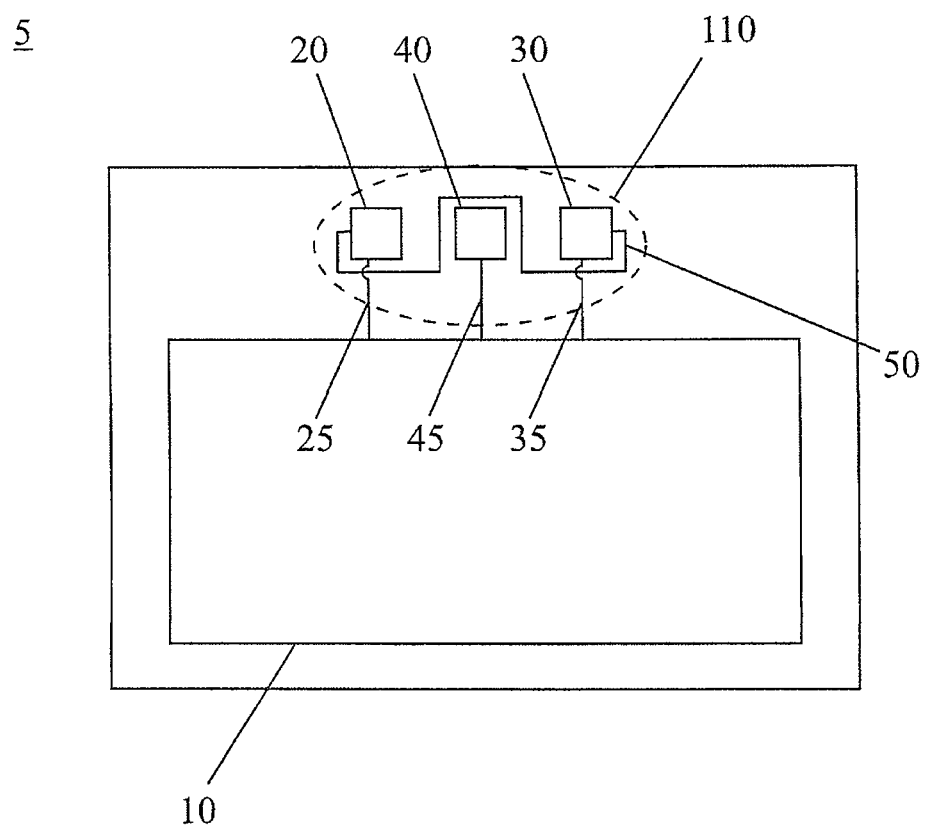
FIG. 2 shows a radio-frequency circuit, a line which connects the signal inputs being routed around a ground point, in accordance with embodiments described herein.

In one exemplary embodiment, the connection 40 which is used as a ground point is arranged between the two signal inputs 20, 30. The line 50 may be routed along the shortest possible connection between the signal inputs or, as illustrated in FIG. 2, may be routed around the ground point in an essentially u-shaped or v-shaped course.

As described above, the line 50 does not have any significant influence on the behavior of the radio-frequency circuit 5 if a symmetrical input signal is applied. Therefore, there is no need, in principle, to remove the line 50 after the tests have been carried out. One reason for removing the line after the tests have been carried out may be that the circuit is intended to be supplied with input signals at considerably different frequencies during subsequent operation. In this case, the length of the line would not correspond to an odd-numbered multiple of λ/2 for each frequency and could therefore contribute to undesirable effects. Therefore, in particular embodiments, it is desirable to make it possible to remove the line 50 or to terminate or occasionally interrupt its ability to conduct signals.

Figure 3:
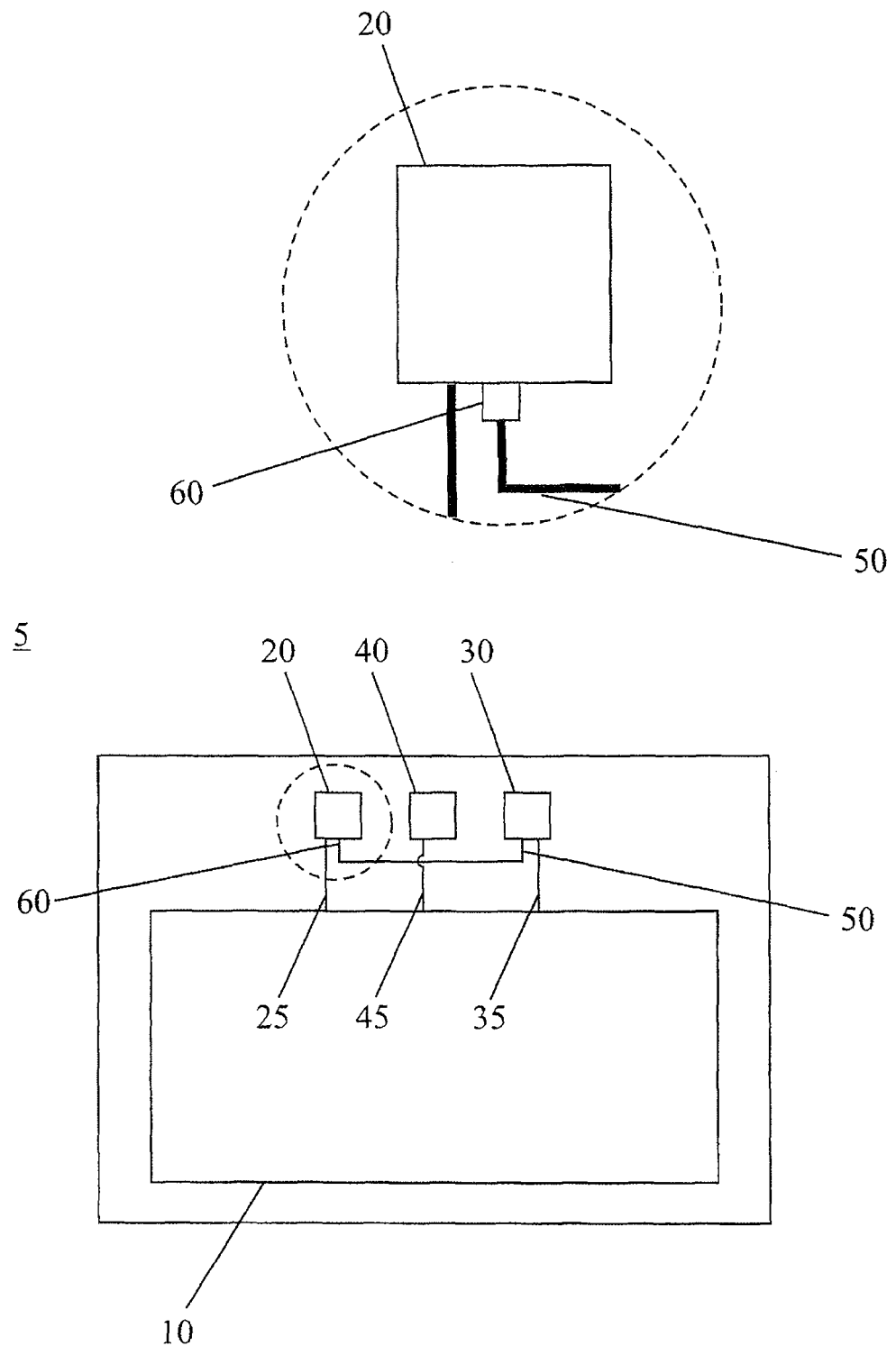
FIG. 3 shows part of a radio-frequency circuit, an interruption unit being provided, in accordance with embodiments described herein.

For this purpose, the embodiments shown in FIG. 3 provide an interruption unit 60 which, in a first state, allows the signal flow via the line 50 between the two signal inputs 20, 30 and, in a second state, interrupts the signal flow via the line between the two signal inputs.

Depending on the embodiment, this interruption, that is to say the consequence of changing from the first to the second state, may be reversible or irreversible. If it is reversible, the radio-frequency circuit 5 may be tested again, if necessary, at a later point in time, for example in order to test components that are claimed to be defective by a customer. The interruption may affect the physical, electrical interruption of the line 50 or its ability to conduct an input signal from one signal input 20, 30 to the other signal input 20, 30. Different reversible and irreversible embodiments are described below.

Figure 4:
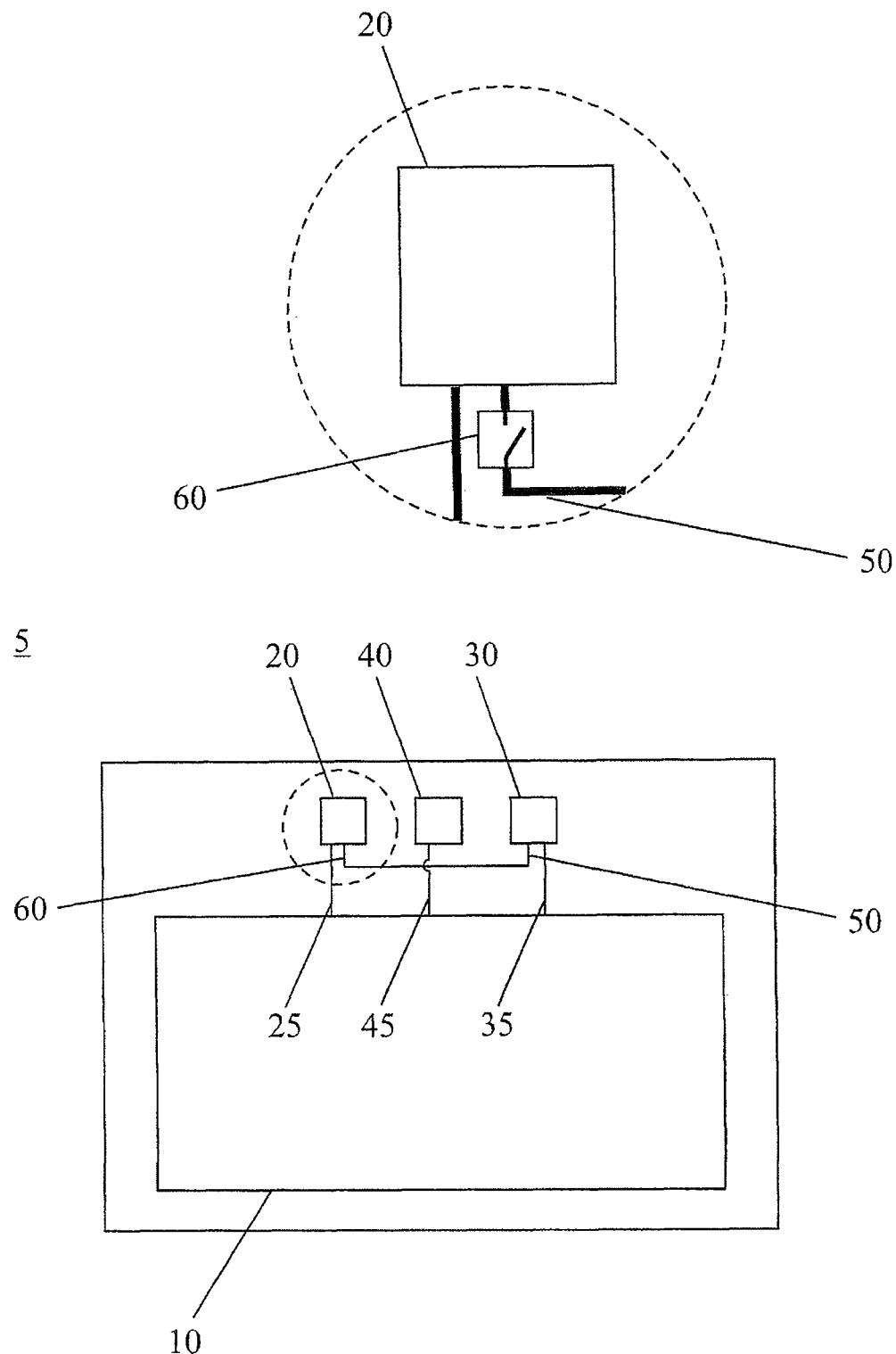
FIG. 4 shows another part of a radio-frequency circuit, a switch which is provided between a connection pad of a signal input and the line being provided as an interruption unit, in accordance with embodiments described herein.

In one embodiment, the interruption unit 60 is in the form of a switching element 70 (FIG. 4). In this case, the line 50 can be changed over as desired between a conductive and a non-conductive state by applying or disconnecting a control voltage. The switching element 70 may be designed using gallium arsenide technology, for example.

Figure 5:
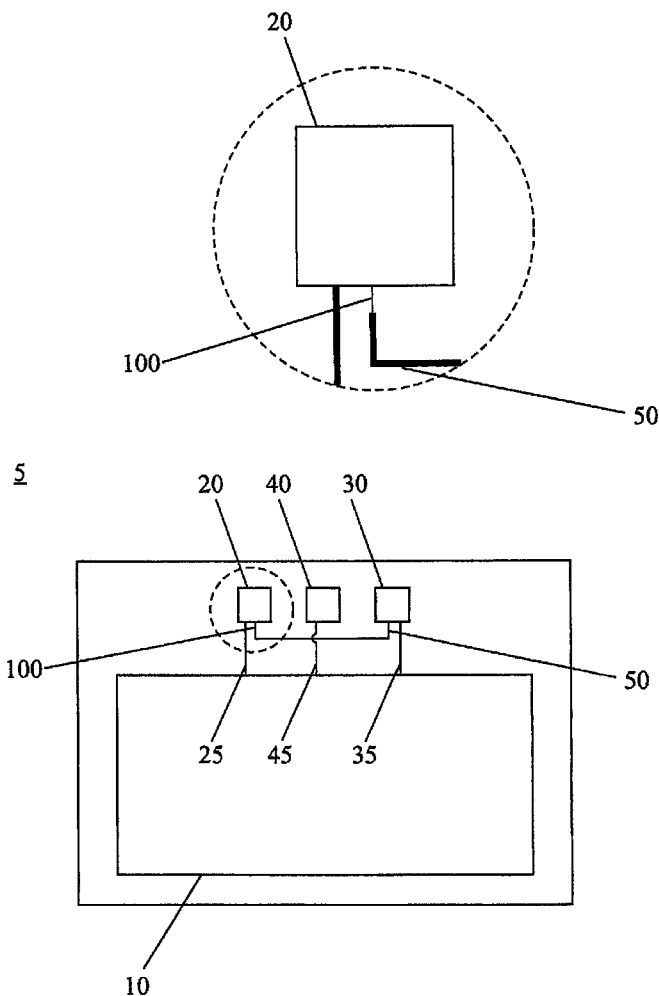
FIG. 5 shows another part of a radio-frequency circuit, a fuse which is provided between a connection pad of a signal input and the line being provided as an interruption unit, in accordance with embodiments described herein.

FIG. 5 shows one exemplary embodiment in which the line 50 is provided with a desired separation point 100 which is also referred to as a fuse 100. The fuse 100 may be designed in such a manner that the line 50 may be easily cut at this point by means of irradiation, for instance by providing a locally reduced thickness or width of the line. A laser is preferably used during the separating operation.

Another embodiment relates to a standard cell for use in a process for designing a radio-frequency circuit and to a design system for designing radio-frequency circuits. Semiconductor circuits are often designed in partially or fully automatic methods using computer programs. Therefore, a standard cell which can be used during such a design process is provided. It comprises two signal inputs for receiving a symmetrical input signal, a connection which is used as a ground point for the symmetrical signal as well as a line which connects the signal inputs and has a length which essentially corresponds to an odd-numbered multiple of half the wavelength of the input signal.

In addition, the standard cell may also comprise all embodiments which represent modifications to this basic design. These include, in particular, the embodiments which are described here and relate to the reversible and irreversible separation of the line and/or the interruption of the signal conduction ability of the line.

Figure 6:
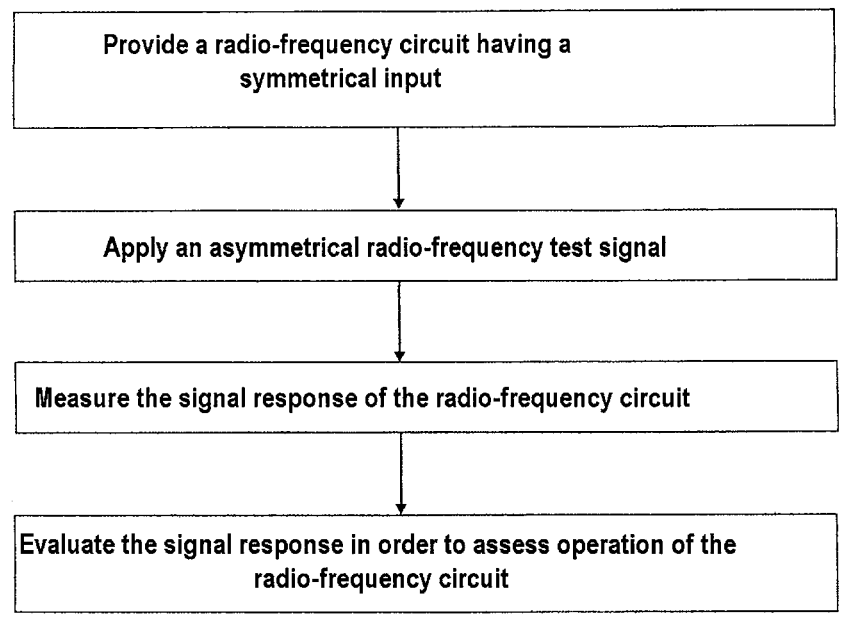
FIG. 6 shows a diagrammatic illustration of a method for testing a radio-frequency circuit having a signal processing unit for processing a symmetrical input signal, in accordance with embodiments described herein.

FIG. 6 diagrammatically shows one embodiment of a test method for a radio-frequency circuit having a signal processing unit for processing a symmetrical input signal. According to this, the following steps are carried out: a radio-frequency circuit according to one of the embodiments described is provided for the test. After an asymmetrical radio-frequency test signal has been applied between one of the signal inputs 20, 30 and the connection 50 which is used as a ground point, the signal response of the radio-frequency circuit is measured at an output of the circuit. The signal response can then be evaluated during conventional quality test methods which are known to a person skilled in the art and can be used as the basis for a decision regarding the freedom from errors/malfunctioning of the radio-frequency circuit to be tested.

In another embodiment of the test method, the step of measuring the signal response is followed by the operation of separating the line 50 between the signal inputs 20, 30 or of preventing the ability of the line to conduct a signal from one signal input to the other signal input, preferably according to one of the embodiments described.

If necessary, the conductivity of the line can be restored in a further step using the techniques described above. It goes without saying that this is only possible when the separating technology used is reversible. Reversible methods for separating the line or for preventing or interrupting its ability to conduct signals were described in detail above.

Embodiments are aimed at production systems which are designed to use the test methods described and at test apparatuses and at systems and methods for designing electronic circuits which use the technologies described.

Whereas the statements made above are aimed at embodiments, other embodiments may be derived from them without departing from the scope of the invention determined by the claims.

What is claimed is:

1. A radio-frequency circuit comprising:
    a signal processing unit for processing a symmetrical input signal,
    two signal inputs for receiving the symmetrical input signal,
    a connection which is used as a ground point for the symmetrical signal,
    a line which connects the signal inputs and has a length equal to an odd-numbered multiple of half the wavelength of the input signal, and
    an interruption unit which, in a first state, allows the signal flow via the line between the two signal inputs and, in a second state, interrupts the signal flow via the line between the two signal inputs.

2. The radio-frequency circuit according to claim 1, wherein the connection which is used as a ground point is arranged between the signal inputs.

3. The radio-frequency circuit according to claim 1, wherein the line is routed along the shortest possible connection between the signal inputs.

4. The radio-frequency circuit according to claim 1, wherein part of the length of the line is routed around the connection, which is used as a ground point, in an essentially u-shaped or v-shaped manner.

5. The radio-frequency circuit according to claim 1, wherein the interruption caused by changing from the first to the second state is reversible.

6. The radio-frequency circuit according to claim 1, wherein the interruption unit comprises a switching element.

7. The radio-frequency circuit according to claim 1, wherein the interruption caused by changing from the first to the second state is irreversible.

8. The radio-frequency circuit according to claim 7, wherein the interruption unit comprises a fuse and/or an antifuse in the line.

9. The radio-frequency circuit according to claim 8, wherein the interruption unit is able to be changed to the second state by means of irradiation, in particular with a laser, or by means of an electrical current.

10. The radio-frequency circuit according to claim 1, wherein the interruption unit is provided at the junction between a connection pad of a signal input and the line.

11. A standard cell for use in a design system for designing radio-frequency circuits, said standard cells comprising:
    two signal inputs for receiving a symmetrical input signal,
    a connection which is used as a ground point for the symmetrical signal,
    a line which connects the signal inputs and has a length equal to an odd-numbered multiple of half the wavelength of the input signal, and
    an interruption unit which, in a first state, allows the signal flow via the line between the two signal inputs and, in a second state, interrupts the signal flow via the line between the two signal inputs.

12. The standard cell according to claim 11, wherein the connection which is used as a ground point is arranged between the signal inputs.

13. The standard cell according to claim 11, wherein the line is routed along the shortest possible connection between the signal inputs.

14. The standard cell according to claim 11, wherein part of the length of the line is routed around the connection, which is used as a ground point, in an essentially u-shaped or v-shaped manner.

15. The standard cell according to claim 11, wherein the interruption caused by changing from the first to the second state is reversible.

16. The standard cell according to claim 15, wherein the interruption unit comprises a switching element.

17. The standard cell according to claim 11, wherein the interruption caused by changing from the first to the second state is irreversible.

18. The standard cell according to claim 17, wherein the interruption unit comprises a fuse and/or an antifuse in the line.

19. The standard cell according to claim 18, wherein the interruption unit is able to be changed to the second state by means of irradiation, in particular with a laser, or by means of an electrical current.

20. The standard cell according to claim 11, wherein the interruption unit is provided at the junction between a connection pad of a signal input and the line.

21. A design system for designing radio-frequency circuits, said system having a standard cell database for storing the parameters of standard cells, and the parameters of a standard cell as claimed in claim 11 is stored in the standard cell database.

* * * * *